(12) United States Patent
Zhang et al.

(10) Patent No.: US 11,217,319 B2
(45) Date of Patent: Jan. 4, 2022

(54) READ THRESHOLD OPTIMIZATION SYSTEMS AND METHODS BY MULTI-DIMENSIONAL SEARCH

(71) Applicant: SK hynix Inc., Gyeonggi-do (KR)

(72) Inventors: Fan Zhang, Fremont, CA (US); Aman Bhatia, Los Gatos, CA (US); Xuanxuan Lu, San Jose, CA (US); Meysam Asadi, Fremont, CA (US); Haobo Wang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/804,211

(22) Filed: Feb. 28, 2020

(65) Prior Publication Data

US 2021/0272641 A1    Sep. 2, 2021

(51) Int. Cl.
| | |
|---|---|
| *G11C 16/34* | (2006.01) |
| *G11C 16/14* | (2006.01) |
| *G11C 16/08* | (2006.01) |
| *G11C 16/26* | (2006.01) |

(52) U.S. Cl.
CPC .......... *G11C 16/3486* (2013.01); *G11C 16/08* (2013.01); *G11C 16/14* (2013.01); *G11C 16/26* (2013.01); *G11C 16/349* (2013.01)

(58) Field of Classification Search
CPC ..... G11C 16/3486; G11C 16/08; G11C 16/14; G11C 16/26; G11C 16/349
See application file for complete search history.

(56) References Cited

U.S. PATENT DOCUMENTS

| | | | |
|---|---|---|---|
| 8,072,805 B2* | 12/2011 | Chou | G11C 16/34 365/185.03 |
| 9,330,775 B2* | 5/2016 | Kim | G11C 16/28 |
| 9,412,471 B2* | 8/2016 | Kim | G06F 11/1068 |
| 10,424,388 B2* | 9/2019 | Oh | G11C 29/04 |
| 2019/0385684 A1 | 12/2019 | Bhatia et al. | |
| 2020/0013471 A1 | 1/2020 | Cohen et al. | |

\* cited by examiner

*Primary Examiner* — Vanthu T Nguyen
(74) *Attorney, Agent, or Firm* — IP & T Group LLP (57) ABSTRACT

A memory controller optimizes read threshold values for a memory device using multi-dimensional search. The controller performs a read operation on cells using a pair of default read threshold values on a multi-dimensional plane. When the read operation has failed, the controller determines program states of cells and a pair of next read threshold values based on the program states and performs an additional read operation using the next read threshold values.

16 Claims, 9 Drawing Sheets

READ THRESHOLD OPTIMIZATION SYSTEMS AND METHODS BY MULTI-DIMENSIONAL SEARCH

BACKGROUND

1. Field

Embodiments of the present disclosure relate to a scheme for optimizing read threshold values in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may use various read thresholds to perform read operations.

SUMMARY

Aspects of the present invention include a memory system and a method for optimizing read threshold values by multi-dimensional search.

In one aspect, a memory system includes a memory device including a plurality of cells and a controller. The controller determines default read thresholds on a 2-dimensional plane, the default read thresholds including a pair of first and second default read thresholds. The controller controls the memory device to perform a read operation on the plurality of cells using the default read threshold values. The controller determines, based on the read operation, a first number of cells, among the plurality of cells, in a first state corresponding to the first default read threshold and a second number of cells, among the plurality of cells, in a second state corresponding to the second default read threshold. The controller compares the first and second numbers of cells with first and second target cell numbers, respectively. The controller determines next read thresholds based on the comparing result. The controller controls the memory device to perform an additional read operation using the next read thresholds.

In another aspect, a method for operating a memory system includes: determining default read thresholds on a 2-dimensional plane, the default read thresholds including a pair of first and second default read thresholds; performing a read operation on a plurality of cells using the default read thresholds; determining, based on the read operation, a first number of cells, among the plurality of cells, in a first state corresponding to the first default read threshold and a second number of cells, among the plurality of cells, in a second state corresponding to the second default read threshold; comparing the first and second numbers of cells with first and second target cell numbers, respectively; determining next read thresholds based on the comparing result; and performing an additional read operation using the next read thresholds.

Additional aspects of the present invention will become apparent from the following description.

DETAILED DESCRIPTION

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

Figure 1:
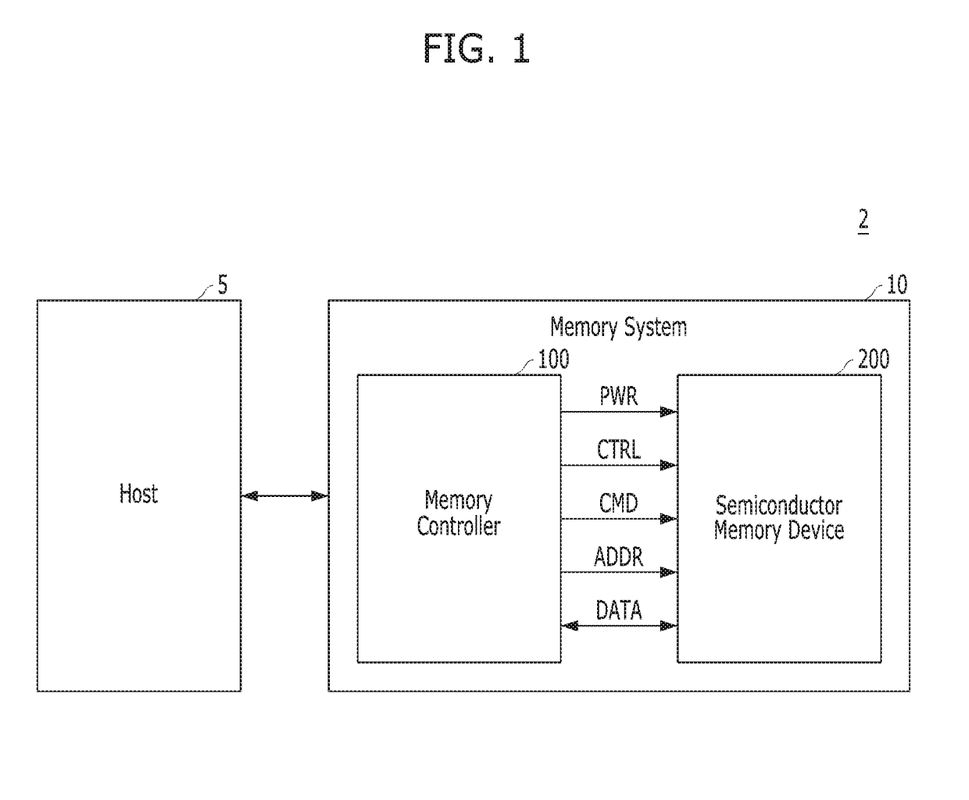
FIG. 1 is a block diagram illustrating a data processing system in accordance with an embodiment of the present invention.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines.

The semiconductor memory device 200 may receive power PWR through a powerline and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
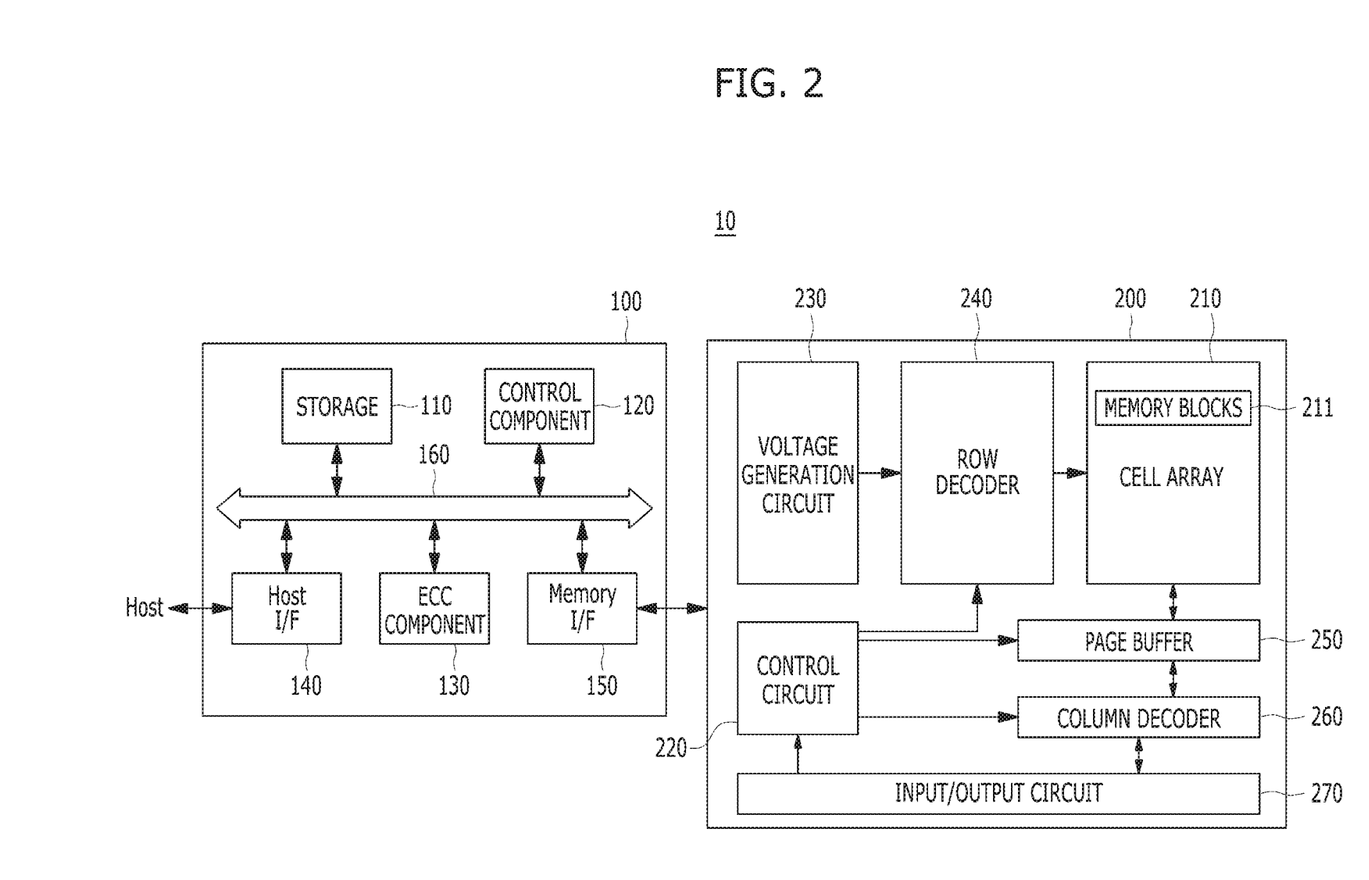
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDDC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (DATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
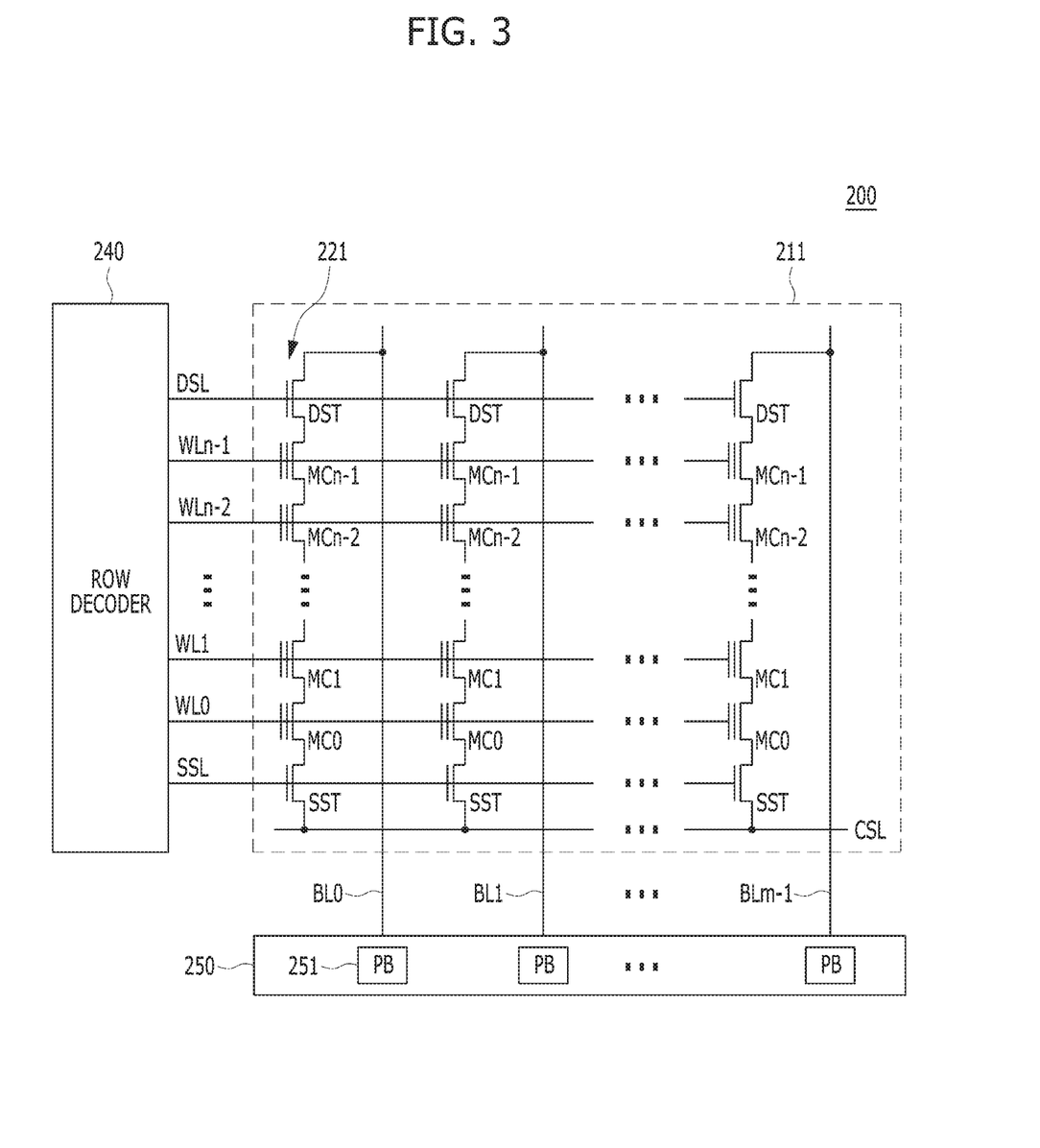
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a con oiler is embedded inside a memory chip.

Figure 4:
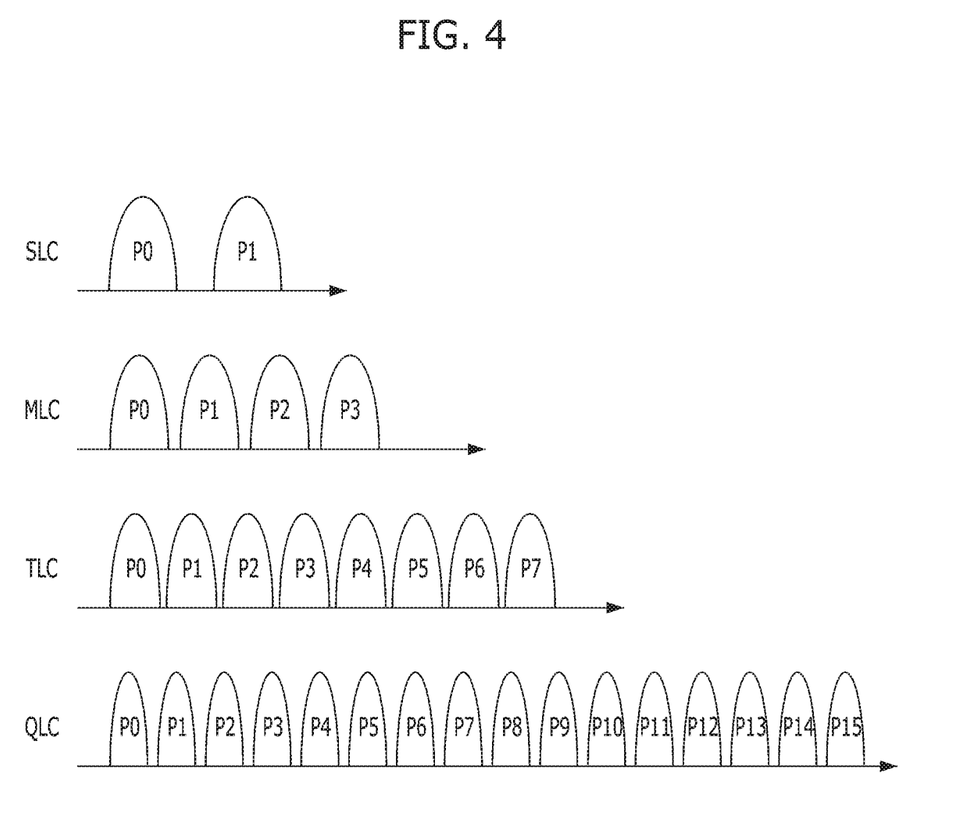
FIG. 4 is a diagram illustrating distributions of states for different types of cells of a memory device.

FIG. 4 is a diagram illustrating distributions of states or program voltage (PV) levels for different types of cells of a memory device.

Referring to FIG. 4, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states each QLC may program or store four bits according to a set coding method.

For an n-bit multiple level cell flash memory as mentioned above, cells can be modulated into multiple states based on their program voltage levels. SLC, MLC, TLC and QLC memories can store one bit, two bits, three bits and four bits respectively in each cell using 2, 4, 8 and 16 possible states. Further, a read operation may be performed for the n-bit multiple level cell flash memory. Reading a page in the n-bit multiple level cell flash memory is performed using multiple read thresholds. In most of the existing read threshold optimization algorithms, read thresholds are optimized separately so that the optimization at each threshold is done independently with respect to other thresholds. These algorithms may be problematic for certain memory cells (e.g., QLC) since thresholds may be dependent as cell level distributions get more and more narrow. Independent threshold optimization generally requires more reads and also leads to sub-optimal read thresholds. Accordingly, various embodiments provide a read threshold optimization scheme using multi-dimensional search. Various embodiments require a relatively low number of reads and lead to more accurate read thresholds.

Figure 5:
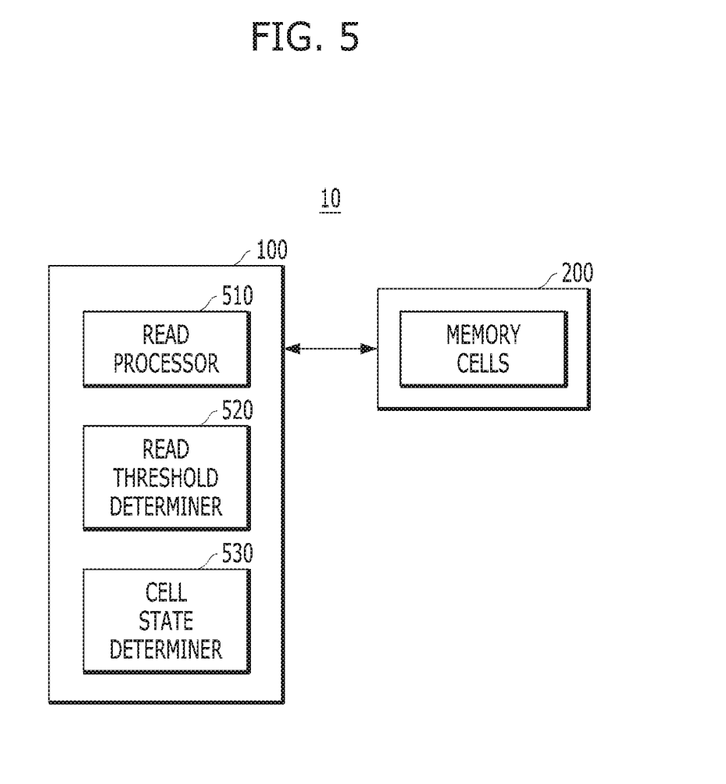
FIG. 5 is a diagram illustrating a memory system in accordance with an embodiment of the present invention.

FIG. 5 is a diagram illustrating a memory system 10 in accordance with an embodiment of the present invention.

Referring to FIG. 5, the memory system 10 may include a controller 100 and a memory device 200. The memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as SSD.

The controller 100 may include a read processor 510, a read threshold determiner 520 and a cell state determiner 530. These components may be implemented with the internal components of the control component 120 (i.e., firmware (FW)) in FIG. 2. Although not shown in FIG. 5, the controller 100 and the memory device 200 may include various other components as shown in FIG. 2.

The read processor 510 may control read operations for the memory device 200 in response to a read request from a host (e.g., the host 5 of FIG. 1). The read processor 510 may control the read operations based on various read threshold values. In some embodiments, the various read threshold values include default read threshold values and next read threshold values on a 2-dimensional (2D) plane. The read processor 510 may control a default read operation for the memory cells using the default read threshold values. When the read operation using the default read threshold values failed, the read processor 510 may control an additional read operation for the memory cells using the next read threshold values.

The read threshold determiner 520 may determine the default read threshold values. In some embodiments, the default read threshold values may include a pair of first and second default read threshold values. When the read operation is performed for the MSB page of TLC, the first default read threshold value is used to distinguish between an erase state (i.e., E or PV0) and a first program state (i.e., PV1), and the second default read threshold value is used to distinguish between a fourth program state (i.e, PV4) and a fifth program state (i.e., PV5).

The cell state determiner 530 may determine the number of cells in each state based on a result the read operation using the default read threshold values. In some embodiments, the cell state determiner 530 may analyze cell patterns to determine program states of cells, i.e., whether cells belong to a certain program state. When the read operation is performed for the MSB page of TLC, a first cell number indicates the number of cells, which belong to a first state (e.g., an erased state E or PV0) corresponding to the first default read threshold, and a second cell number indicates the number of cells, which belong to a second state (e.g., a fifth program state PV5, a sixth program state PV6 or a seventh program state PV7) corresponding to the second default read threshold.

When the read operation using the default read threshold values failed, the read threshold determiner 520 may determine the next read threshold values. The read threshold determiner 520 may compare the numbers of cells in different states with respective target cell numbers including first and second target cell numbers. Further, the read threshold determiner 520 may determine the next read threshold values based on the comparing result. In some embodiments, the read threshold determiner 520 may determine a direction and a step size for the first next read threshold, based on a difference between the first number of cells and the first target cell number and determine a direction and a step size for the second next read threshold value, based on a difference between the second number of cells with the second target cell number.

When the read operation using the default read threshold values failed, the read processor 510 may cause additional read operations (or iterations of an additional read operation) for the memory cells to be performed using the next read threshold values. In an embodiment, the additional read operations may be performed a set maximum number of times. In other words, after the additional read operations have been performed the set maximum number of times, no further additional read operations are performed. In another embodiment, no maximum number of iterations may be set; instead, iterations of the additional read operation may be repeatedly performed until it is determined that one such iteration has succeeded. For example, when the difference between the first number of cells and the first target cell number is less than a set first distance and the difference between the second number of cells with the second target cell number are less than a set second distance, it is determined that the additional read operations have succeeded.

Figure 6:
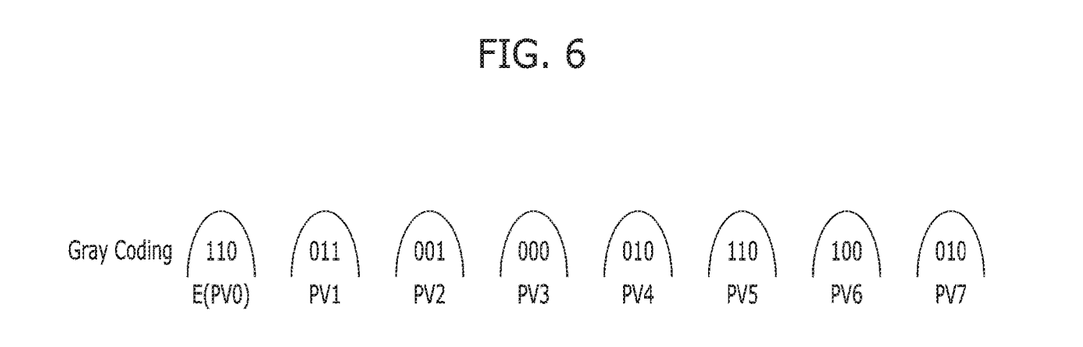
FIG. 6 is a diagram illustrating an example of Gray coding for a triple level cell (TLC).

FIG. 6 is a diagram illustrating an example of Gray coding for a triple level cell (TLC).

Referring to FIG. 6, the TLC may be programmed using Gray coding. The TLC may have 8 program states, which include an erased state E (or PV0) and a first program state PV1 to a seventh program state PV7, The erased state E (or PV0) may correspond to "110." The first program state PV1 may correspond to "011." The second program state PV2 may correspond to "001." The third program state PV3 may correspond to "000." The fourth program state PV4 may correspond to "010." The fifth program state PV5 may correspond to "110." The sixth program state PV6 may correspond to "100." The seventh program state PV7 may correspond to "101."

Figure 7:
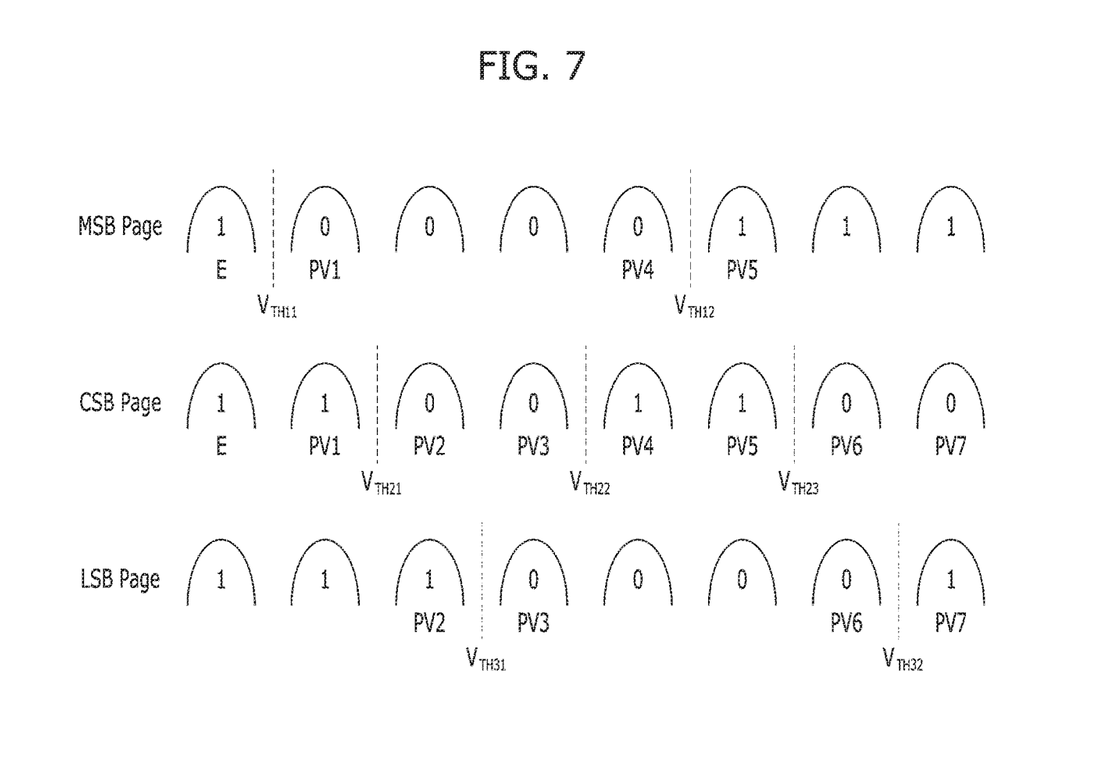
FIG. 7 is a diagram illustrating state distributions for pages of a triple level cell (TLC).

In the TLC, as shown in FIG. 7, there are 3 types of pages including LSB, CSB and MSB pages. 2 or 3 thresholds may be applied in order to retrieve data from the TLC. For an MSB page, 2 thresholds include a first threshold value $V_{TH11}$ and a second threshold value $V_{TH12}$. The first threshold value $V_{TH11}$ distinguishes between an erase state E and a first program state PV1. The second threshold value $V_{TH12}$ distinguishes between a fourth program state PV4 and a fifth program state PV5. For a CSB page, 3 thresholds include a first threshold value a second threshold value $V_{TH22}$ and a third threshold value $V_{TH23}$. The first threshold value $V_{TH21}$ distinguishes between a first program state PV1 and a second program state PV2. The second threshold value $V_{TH22}$ distinguishes between a third program state PV3 and the fourth program state PV4. The third threshold value $V_{TH23}$ distinguishes between the fourth program state PV5 and the sixth program state PV6. For an LSB page, 2 thresholds include a first threshold value $V_{TH31}$ and a second threshold value $V_{TH32}$. The first threshold value $V_{TH31}$ distinguishes between the second program state PV2 and the third program state PV3. The second threshold value $V_{TH32}$ distinguishes between the sixth program state PV6 and a seventh program state PV7.

Figure 8:
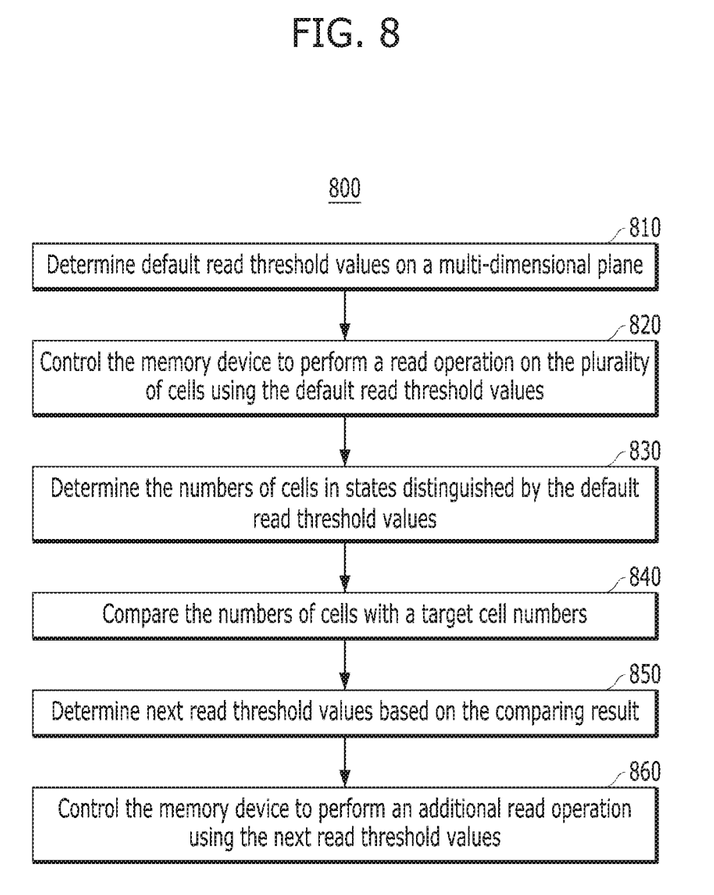
FIG. 8 is a flowchart illustrating a read threshold optimization operation using a multi-dimensional search in accordance with an embodiment of the present invention.

FIG. 8 is a flowchart illustrating a read threshold optimization operation 800 using a multi-dimensional search in accordance with an embodiment of the present invention. The read threshold optimization operation 800 may be performed by components 510, 520 and 530 of the controller 100 in FIG. 5. The read threshold optimization operation 800 may find (or approach) a target point in a multi-dimensional linear space, instead of trying to find a specific optimal read threshold.

Referring to FIG. 8, the read threshold optimization operation 800 may include steps 810 to 850. The read threshold optimization operation 800 may be performed on the plurality of cells of the memory device 200 in FIG. 5. The cells are coupled to a word line and includes multiple pages. In some embodiments, the cells are programmed using a set coding scheme (e.g., Gray coding) and the multiple pages include a most significant bit (MSB) page, a center significant bit (CSB) page and a least significant bit (LSB) page.

At step 810, the controller 100 may determine default read threshold values on a multi-dimensional plane (e.g., a 2-dimensional plane). In the illustrated embodiment, there are two default read threshold values for MSB or LSB pages of TLC. In another embodiment, there are three default read threshold values for CSB page of TLC. At step 820, the controller 100 may control the memory device 200 to perform a read operation on the plurality of cells using the default read threshold values.

At step 830, for each default read threshold value, the controller 100 may determine the numbers of cells in states distinguished by the default read threshold value. A first cell number indicates the number of cells among the plurality of cells that belong to a first state among the states distinguished by the first default read threshold. A second cell number indicates the number of cells among the plurality of cells that belong to a second state among the states distinguished by the second default read threshold.

In some embodiments, including the illustrated embodiment, when the read operation is performed for the MSB page, the first default read threshold value is used to distinguish between an erase state and a first program state, and the second default read threshold value is used to distinguish between a fourth program state and a fifth program state. For example, the first state is the erase state and the second state is one of the fifth program state, a sixth program state and a seventh program state.

At step 840, the controller 100 may compare the number of cells in the first state, e.g., the erased state, with a first target cell number, and may compare the number of cells in the second state, e.g., PV5, PV6 or PV7, with a second target cell number. At step 850, the controller 100 may determine next read threshold values based on the comparing result. In some embodiments, the next read threshold values include a pair of first and second next read threshold values. At step 860, the controller 100 may control the memory device 200 to perform an additional read operation using the next read threshold values, which additional read operation may be performed a set number of times or up to a maximum number of times.

In some embodiments, the determining of the next read threshold values includes determining a direction and a step size for the first next read threshold value, based on a difference between the first cell number and the first target cell number, and determining a direction and a step size for the second next read threshold value, based on a difference between the second cell number and the second target cell number.

Figure 9:
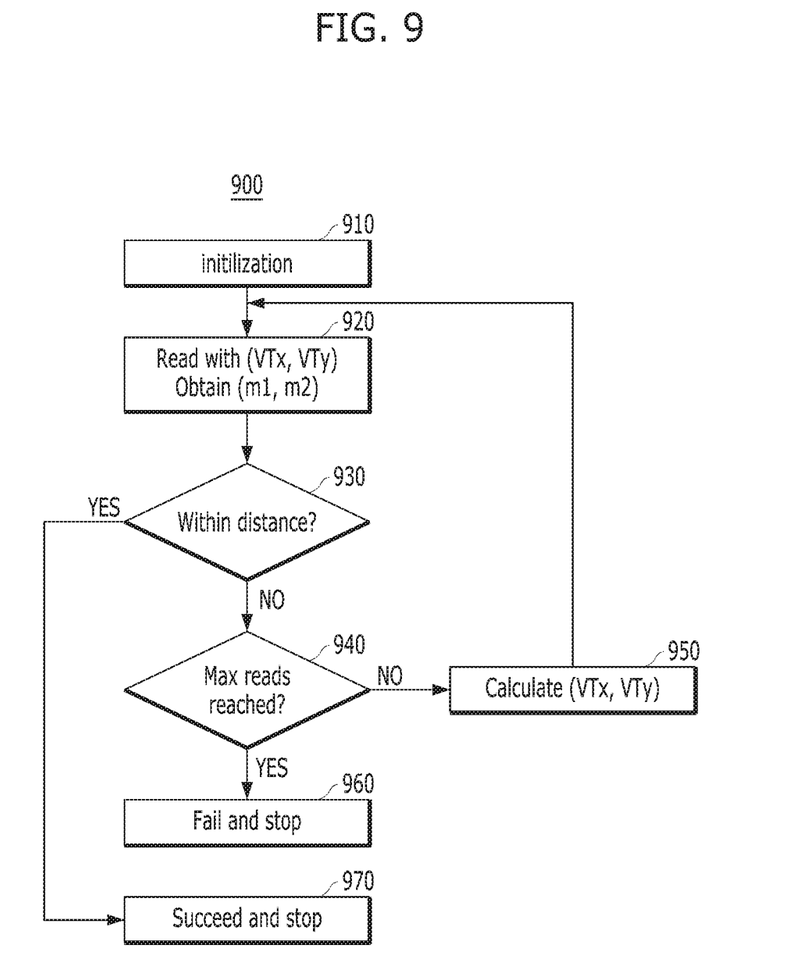
FIG. 9 is a flowchart illustrating a read threshold optimization operation using a 2-dimensional (2D) search in accordance with an embodiment of the present invention.

FIG. 9 is a flowchart illustrating a read threshold optimization operation 900 using a 2-dimensioinal (2D) search in accordance with an embodiment of the present invention. The read threshold optimization operation 900 may be performed by components 510, 520 and 530 of the controller 100 in FIG. 5. In some embodiments, the read threshold optimization operation 900 may be performed for TLC.

Referring to FIG. 9, the read threshold optimization operation 900 may include steps 910 to 970. At step 910, the read threshold determiner 520 may perform initialization. For each of the LSB, CSB and MSB pages, the read threshold determiner 520 may set default read threshold values. For an MSB page, the read threshold determiner 520 may set default read threshold values to be (VTx, VTy) as a point on a 2D plane. As shown in FIG. 7, the first default read threshold value VTx (or $V_{TH11}$) is used to distinguish between an erase state E and a first program state PV1, and the second default read threshold value VTy (or $V_{TH12}$) is used to distinguish between a fourth program state PV4 and a fifth program state PV5. By way example and without any limitation, FIG. 9 illustrates the read threshold optimization operation 900 for an MSB page of TLC. However, the read threshold optimization operation 900 may be applied to other pages (i.e., LSB and CSB pages) of TLC, pages (i.e., MSB, LSB, CMSB and CLSB pages) of QLC or other types of NANDs consistent with the teachings herein.

At step 920, the read processor 510 may control a TLC-based memory device to perform a read operation using the default read threshold values. In other words, for an MSB page read, the read processor 510 may perform 2 reads using two read thresholds, i.e., read threshold pair (VTx, VTy). Further, the cell state determiner 530 may analyze cell patterns (or patterns of states to which cells belong) to determine program states of cells. In other words, the cell state determiner 530 may determine that a fraction of cells that are read back are in the erase state, which fraction is denoted as m1 (which is given in decimal form herein), and also that a fraction of cells that are read back are in PV5, PV6 or PV7, which fraction is denoted as m2 (which is given in decimal form herein). For example, after the first 2 reads, it may be determined that m1=0.1 and m2=0.42 as shown in Step1 of FIG. 10. That means that 10% of all cells read back are determined to be in the erase state, and 42% of all cells read back are determined to be in one of the program states PV5, PV6 or PV7. To obtain the number of cells represented by m1, it is multiplied by the total number of cells read. A corresponding calculation is done to obtain the number of cells represented by m2.

Additional read operations in step 920 may be performed until the condition of step 930 or step 940 is satisfied. For the additional read operation(s), a search is performed to determine new read threshold values in step 950.

Figure 10:
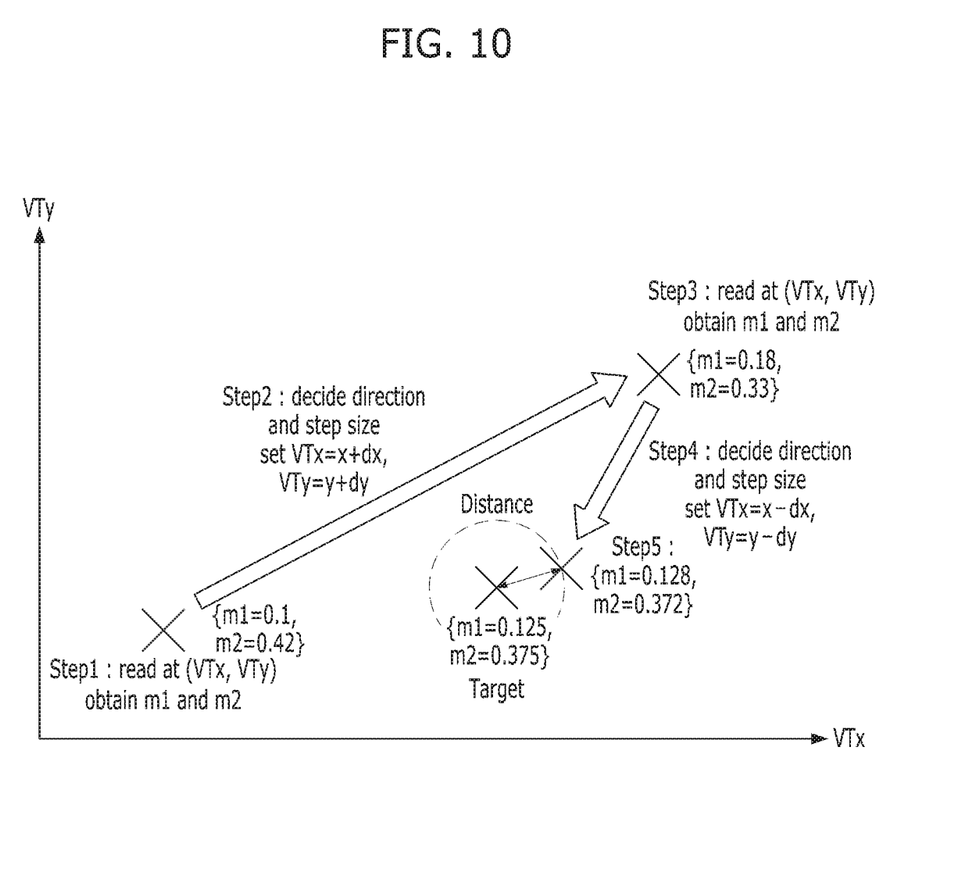
FIG. 10 illustrates an example of read threshold optimization using a 2-dimensioinal (2D) search in accordance with an embodiment of the present invention.

At step 930, the read processor 510 may compare the numbers of cells represented by m1=0.1 and m2=0.42 with respective target cell numbers to determine whether the m1 cell number is within a set distance (or a threshold distance) from its corresponding target cell number and whether the m2 cell number is within the set distance from its target cell number. In some embodiments, the read processor 510 may calculate the Euclidean distance between the current cell pair (m1, m2) and the target cell numbers (0.125, 0.375). The Euclidean distance may be calculated between the current cell pair (m1, m2) and the target cell numbers (0.125, 0.375), which can be seen as two points in a two-dimensional plane. Specifically, the Euclidean distance is calculated by $\sqrt{D} = \sqrt{(m1-0.125)^2 + (m2-0.375)^2}$. For example, the target cell numbers for m1 and m2 may be set to (m1=0.125, m2=0.375) as shown in FIG. 10. Specifically, there are eight states for TLC. Since data written in the TLC memory device is scrambled, the fraction of the cells fall into each state should be same (i.e., for TLC, ⅛=0.125). For TLC, there is one erase state (i.e., nil), and three states PV5, PV6 and PV7 (i.e., m2) with voltage larger than threshold VTy. Thus, the target cell number for m1 is 0.125; the target cell number for m2 is 0.125 3=0.375. Further, the read processor 510 may determine whether the current cell pair (m1, m2) is within the set distance from the target cell numbers (0.125, 0.375). When the distance requirement is satisfied for both the m1 and m2 cell numbers (S930, YES), the read processor 510 may go to step S970, where it is determined that one or more read operations of step 920 succeeded and the operation 900 is stopped.

When it is determined that the distance requirement is not satisfied (S930, NO), the read processor 510 may determine at step 940 whether the number of read operations performed at step 920 has reached a set maximum number. When it is determined that the maximum number of read operations has been reached (S940, YES), the read processor 510 may determine at step 960 that one or more read operations performed at step 920 failed and stop the operation 900.

When it is determined that the maximum number of read operations has not been reached (S940, NO), the read processor 510 may perform step S950. At step 950, the read threshold determiner 520 may determine new read threshold values for the next read operation, based on the page type (i.e., MSB) and pairs (VTx, VTy) and (m1, m2), which were previously obtained in step 920. The step 950 may be regarded as a process to find the gradient and step size based on the current estimate of where the optimal read threshold pair would be and the distance to it.

In some embodiments, a multivariate regression model (or general linear model) may be used to describe the relationship between [VTx, VTy] and [m1 and m2]. For example, a multivariate regression model can be built between [m1, m2] and [VTx, VTy] with a regress parameter (or parameter matrix) β as Equation (1).

$$[m1, m2] = [VTx, VTy]\beta \quad (1)$$

In Equation 1, regression parameter can be computed by the Moore-Penrose pseudo-inverse equation listed below as Equation (2). β' is the solution to β in Equation 1.

$$\beta' = ([VTx, VTy]^T[VTx, VTy])^{-1}[VTx, VTy]^T(m1, m2) \quad (2)$$

In some embodiments, the read threshold determiner 520 may compare the obtained pair of cell numbers (m1=0.1, m2=0.42) with the pair of target cell numbers (m1=0.125, m2=0.375). Further, the read threshold determiner 520 may decide directions and step sizes from the pair of previous read threshold values based on the comparison result and determine the pair of next read threshold values based on the decided directions and step sizes. For example, as shown in Step2 of FIG. 10, the read threshold determiner 520 may determine a direction (+ or −) and a step size (dx) for a first next read threshold value (VTx), based on a difference between the first cell number (m1=0.1) and the first target cell number (m1=0.125). In other words, the first next read threshold value (VTx) is set from the first previous read threshold value (x) (i.e., VTx=x+dx). Further, as shown in Step2 of FIG. 10, the read threshold determiner 520 may determine a direction (+ or −) and a step size (dx) for a second next read threshold value (VTy), based on a difference between the second cell number (m1=0.1, m2=0.42) and the second target cell number (m1=0.125, m2=0.375). In other words, the second next read threshold value (VTy) is set from the second previous read threshold value (y) (i.e., VTy=y+dy).

When the pair of next read threshold values is determined, at step 920, the read processor 510 may control the TLC-based memory device to perform an additional read operation using the pair of next read threshold values. Further, the cell state determiner 530 may analyze cell patterns to determine program states of cells. For example, the pair of cell numbers (m1=0.18, m2=0.33) is obtained as shown in Step3 of FIG. 10. Since the obtained pair of cell numbers (m1=0.18, m2=0.33) is not within a set distance to the target values (m1=0.125, m2=0.375), further operations are performed as shown in Step4 and Step5 of FIG. 10. In other words, when the pair of cell numbers (m1=0.128, m2=0.372), which is obtained through the further operations, is within a set distance to the target values (m1=0.125, m2=0.375), the search operation for a pair of optimal read threshold values may stop.

As described above, embodiments provide a scheme for optimizing read threshold values using multi-dimensional search. This scheme requires a relatively few number of reads and leads to more accurate read thresholds.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
a memory device including a plurality of cells; and
a controller, coupled to the memory device, suitable for:
determining default read thresholds on a 2-dimensional plane, the default read thresholds including a pair of first and second default read thresholds;
controlling the memory device to perform a read operation on the plurality of cells using the default read threshold values;
determining, based on the read operation, a first number of cells, among the plurality of cells, in a first state corresponding to the first default read threshold and a second number of cells, among the plurality of cells, in a second state corresponding to the second default read threshold;
comparing the first and second numbers of cells with first and second target cell numbers, respectively;
determining next read thresholds based on the comparing result; and
controlling the memory device to perform an additional read operation using the next read thresholds,
wherein the next read thresholds include a pair of first and second next read thresholds,
wherein the first next read threshold is determined based on a direction and a step size from the first default read threshold, which are determined based on a first difference between the first number of cells and the first target cell number,
wherein the second next read threshold is determined based on a direction and a step size from the second default read threshold, which are determined based on a second difference between the second number of cells and the second target cell number,
wherein the plurality of cells includes multiple pages, each page having multiple states, and each of the first and second default read voltages distinguishes two adjacent states among the multiple states, and
wherein the first target cell number is determined based on the number of the multiple states and the number of one or more lower states as the first state, which are distinguished by the first default read voltage among the multiple states, and the second target cell number is determined based on the number of the multiple states and the number of one or more upper states as the second state, which are distinguished by the second default read voltage among the multiple states.

2. The memory system of claim 1, wherein the plurality of cells is coupled to a word line and includes the multiple pages.

3. The memory system of claim 2, wherein the multiple pages include a most significant bit (MSB) page, a center significant bit (CSB) page and a least significant bit (LSB) page.

4. The memory system of claim 3, wherein the plurality of cells is programmed using Gray coding.

5. The memory system of claim 4, wherein, when the read operation is performed for the MSB page,
the first default read threshold distinguishes between an erase state and a first program state, and the second default read threshold distinguishes between a fourth program state and a fifth program state.

6. The memory system of claim 5, wherein the first state is the erase state and the second state is one of the fifth program state, a sixth program state and a seventh program state.

7. The memory system of claim 4, wherein the controller stops the performing of the additional read operation when the difference between the first number of cells and the first target cell number and the difference between the second number of cells and the second target cell number are each less than a set distance.

8. The memory system of claim 4, wherein the controller stops the performing of the additional read operation when the additional read operation has been performed more than a set number of iterations.

9. A method for operating a memory system, which includes a memory device including a plurality of cells and a controller coupled to the memory device, the method comprising:

determining default read thresholds on a 2-dimensional plane, the default read thresholds including a pair of first and second default read thresholds;

performing a read operation on the plurality of cells using the default read thresholds;

determining, based on the read operation, a first number of cells, among the plurality of cells, in a first state corresponding to the first default read threshold and a second number of cells, among the plurality of cells, in a second state corresponding to the second default read threshold;

comparing the first and second numbers of cells with first and second target cell numbers, respectively;

determining next read thresholds based on the comparing result; and performing an additional read operation using the next read thresholds, wherein the next read thresholds include a pair of first and second next read thresholds, wherein the determining of the next read thresholds includes:

determining the first next read threshold based on a direction and a step size from the first default read threshold, which are determined based on a first difference between the first number of cells and the first target cell number; and determining the second next read threshold based on a direction and a step size from the second default read threshold, which are determined based on a second difference between the second number of cells and the second target cell number, wherein the plurality of cells includes multiple pages, each page having multiple states, and each of the first and second default read voltages distinguishes two adjacent states among the multiple states, and wherein the first target cell number is determined based on the number of the multiple states and the number of one or more lower states as the first state, which are distinguished by the first default read voltage among the multiple states, and the second target cell number is determined based on the number of the multiple states and the number of one or more upper states as the second state, which are distinguished by the second default read voltage among the multiple states.

10. The method of claim 9, wherein the plurality of cells is coupled to a word line and includes the multiple pages.

11. The method of claim 10, wherein the multiple pages include a most significant bit (MSB) page, a center significant bit (CSB) page and a least significant bit (LSB) page.

12. The method of claim 11, wherein the plurality of cells is programmed using Gray coding.

13. The method of claim 12, wherein, when the read operation is performed for the MSB page, the first default read threshold distinguishes between an erase state and a first program state, and the second default read threshold distinguishes between a fourth program state and a fifth program state.

14. The method of claim 13, wherein the first state is the erase state and the second state is one of the fifth program state, a sixth program state and a seventh program state.

15. The method of claim 12, further comprising:

stopping the performing of the additional read operation when the difference between the first number of cells and the first target cell number and the difference between the second number of cells and the second target cell number are each less than a set distance.

16. The method of claim 12, further comprising:

stopping the performing of the additional read operation when the additional read operation has been performed more than a set number of iterations.

* * * * *